US007969100B2

(12) United States Patent
Xu et al.

(10) Patent No.: US 7,969,100 B2

(45) Date of Patent: Jun. 28, 2011

(54) BULB TYPE DETECTOR FOR DIMMER CIRCUIT AND INVENTIVE RESISTANCE AND SHORT CIRCUIT DETECTION

(75) Inventors: Jian Xu, Windsor (CA); Jeffrey Iott, Monroe, MI (US); Thomas Alan Barnett, Ypsilanti, MI (US)

(73) Assignee: Liberty Hardware Manufacturing Corp., Winston-Salem, NC (US)

( * ) Notice: Subject to any disclaimer, the term of this patent is extended or adjusted under 35 U.S.C. 154(b) by 992 days.

(21) Appl. No.: 11/749,826

(22) Filed: May 17, 2007

(65) Prior Publication Data

US 2008/0284350 A1 Nov. 20, 2008

(51) Int. Cl.
*H05B 37/02* (2006.01)
*G01R 27/08* (2006.01)

(52) U.S. Cl. ........................................ 315/291; 324/711

(58) Field of Classification Search .................. 315/219, 315/307, 224, 308, 360, 209 R; 324/676, 324/677, 678, 710, 711
See application file for complete search history.

(56) References Cited

U.S. PATENT DOCUMENTS 5,430,356 A 7/1995 Ference et al.
5,530,322 A 6/1996 Ference et al.
5,608,293 A * 3/1997 Blom ............................ 315/219
5,910,875 A * 6/1999 Tian et al. ........................ 361/78
5,952,791 A 9/1999 Watanabe et al.
5,990,635 A 11/1999 Ference et al.
6,008,593 A 12/1999 Ribarich
6,046,550 A 4/2000 Ference et al.
6,081,123 A * 6/2000 Kasbarian et al. ............ 324/521
6,188,181 B1 2/2001 Sinha et al.
6,300,727 B1 10/2001 Bryde et al.
6,366,031 B2 4/2002 Klien
6,380,692 B1 4/2002 Newman, Jr. et al.
6,577,076 B2 * 6/2003 Li et al. ......................... 315/291
6,804,129 B2 * 10/2004 Lin ................................ 363/98
6,836,082 B2 12/2004 Buij et al.
7,015,654 B1 * 3/2006 Kuhlmann et al. ........... 315/291
7,030,916 B2 4/2006 Aotsuka (Continued)

FOREIGN PATENT DOCUMENTS

EP 1387489 2/2004

(Continued)

OTHER PUBLICATIONS

L.M. Lee et al., An Automatic Lamp Detection Technique for Electronic Ballasts, Article, 2005. part 1, pp. 578-581.

(Continued)

*Primary Examiner* — Douglas W Owens
*Assistant Examiner* — Minh D A
(74) *Attorney, Agent, or Firm* — Carlson, Gaskey & Olds, PC

(57) ABSTRACT

A bulb detection circuit is associated with a dimmer circuit for a lighting system. The bulb detection circuit is operable to detect whether an incandescent or a fluorescent bulb is received in an electric light socket. The socket may be hardwired to the circuit, or could be plugged into an electrical outlet. The bulb detection circuit may utilize a separately inventive method of measuring the resistance by looking at an RC circuit time constant. Further, the bulb detection circuit may utilize a separately inventive method of identifying a short circuit by again looking at the RC circuit time constant.

28 Claims, 3 Drawing Sheets

U.S. PATENT DOCUMENTS

| | | | | |
|---|---|---|---|---|
| 7,106,261 | B2 | 9/2006 | Nagel et al. | |
| 7,173,381 | B2 * | 2/2007 | Hyeon-Yong | 315/224 |
| 2005/0156534 | A1 | 7/2005 | Oh | |
| 2006/0215345 | A1 | 9/2006 | Huizenga | |
| 2007/0001624 | A1 * | 1/2007 | Blondia | 315/291 |
| 2007/0090775 | A1 | 4/2007 | Ribarich | |

FOREIGN PATENT DOCUMENTS

| | | |
|---|---|---|
| JP | 2002025787 | 1/2002 |
| KR | 20040061649 | 7/2004 |
| WO | 2005060320 | 6/2005 |

OTHER PUBLICATIONS

T.A. Hough, Measuring and Modeling Intensity Distributions of Light Sources in Waveguide Illumination Systems, Article, Mar. 1995, pp. 819-823, vol. 34 No. 3.

International Search Report and Written Opinion dated Jul. 7, 2008.

* cited by examiner

BULB TYPE DETECTOR FOR DIMMER CIRCUIT AND INVENTIVE RESISTANCE AND SHORT CIRCUIT DETECTION

BACKGROUND OF THE INVENTION

This application relates to a lighting control system including a dimmer circuit, which identifies the type of bulb connected to the dimmer circuit. In addition, the bulb detection circuit relies on a separately inventive method of determining a resistance, and a separately inventive method of determining short or open circuits.

Lighting control systems are known, and may include dimmer circuits. As known, a dimmer circuit limits the light intensity of a bulb in some manner.

In modern buildings, there may be incandescent bulbs and fluorescent bulbs. Historically, residential lighting was provided more by incandescent bulbs, however, fluorescent bulbs are being mandated by government regulation.

To date, the prior art has not provided a method of identifying whether a bulb in a particular outlet is an incandescent or a fluorescent bulb.

In addition, while several methods are known for determining the resistance of an electrical component, and for determining a short or open circuit on a portion of a circuit, those known methods have been relatively expensive, complex, and not necessarily effective.

SUMMARY OF THE INVENTION

In one aspect of this invention, a dimmer circuit is provided with a bulb detection circuit. In one embodiment, the bulb detection circuit looks at the resistance on a load when a low voltage is applied to the load. By monitoring the time constant of an RC circuit in the bulb detection circuit, the circuit can initially identify whether the bulb in an electrical outlet is likely incandescent or the load has a short circuit. In a second step, the circuit may then determine whether the load has an open circuit or is a fluorescent light by again looking at the time constant of the RC circuit. The results of this determination, which can be performed each time the lighting circuit is turned on, is provided to a control for the dimmer circuit. The dimmer circuit may be operated with an appropriate control algorithm depending on the bulb type.

The method of utilizing the RC circuit time constant to measure a resistance is a separately inventive way of measuring resistance for any application. Further, the detection of a short or open circuit by looking at the RC time constant is also separately inventive for any application.

These and other features of the present invention can be best understood from the following specification and drawings, the following of which is a brief description.

DETAILED DESCRIPTION OF THE PREFERRED EMBODIMENT

Figure 1:
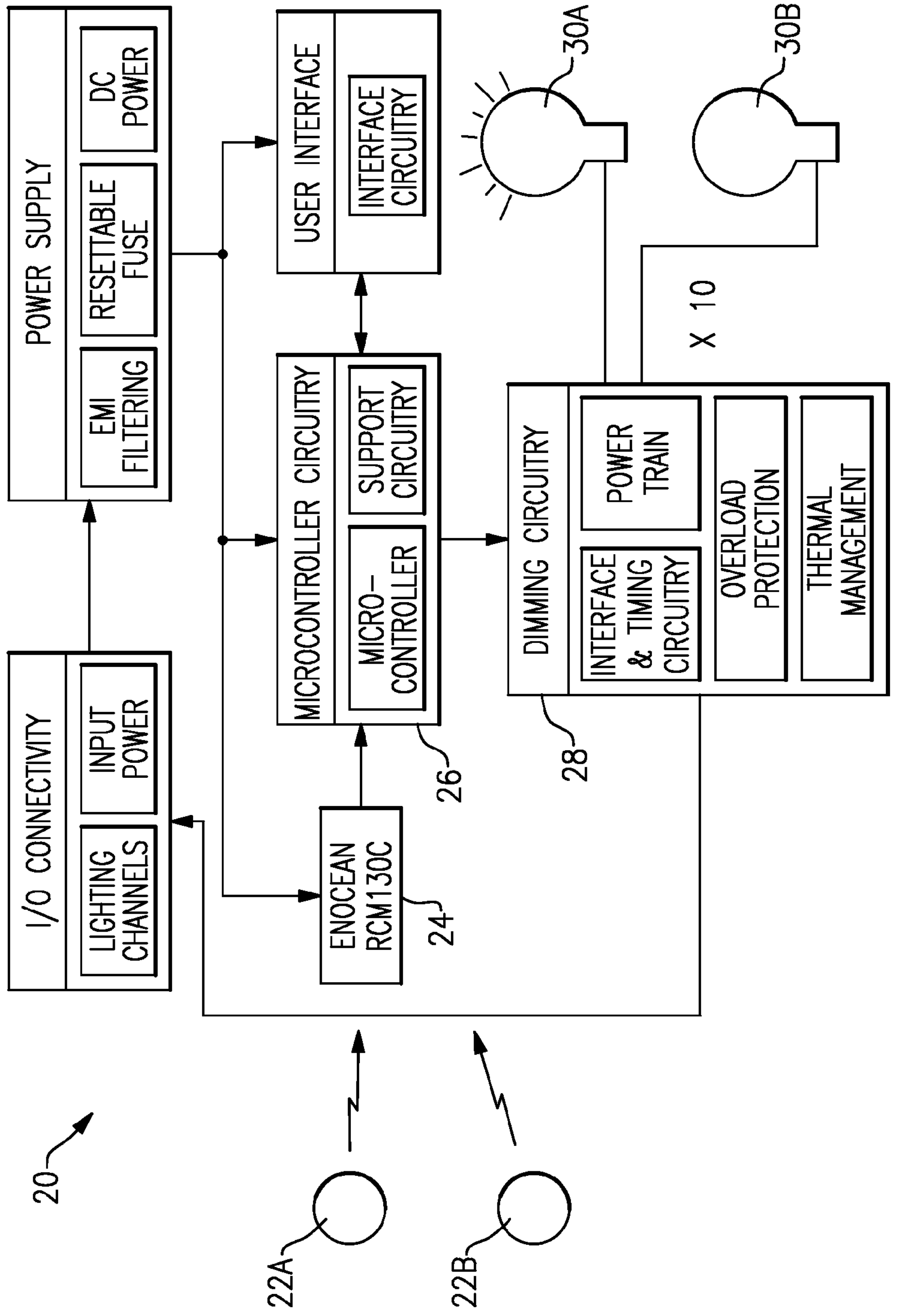
FIG. 1 is a schematic view of an overall lighting system.

FIG. 1 shows a lighting control circuit 20 for a building. As shown, a plurality of switches 22A, 22B, etc. communicate through a wireless connection to a multi-channel receiver 24. This receiver may be as available from Enocean, and available for example under its Product No. RCM130C. The use of a wireless receiver and wireless switches are not limiting on this invention, but only mentioned as one possible type of system.

The receiver 24 communicates with a microcontroller 26, which in turn communicates with dimmer circuit 28. The dimmer circuits 28 (only one of which is shown) control the intensity of lights 30A, 30B, etc.

Figure 2:
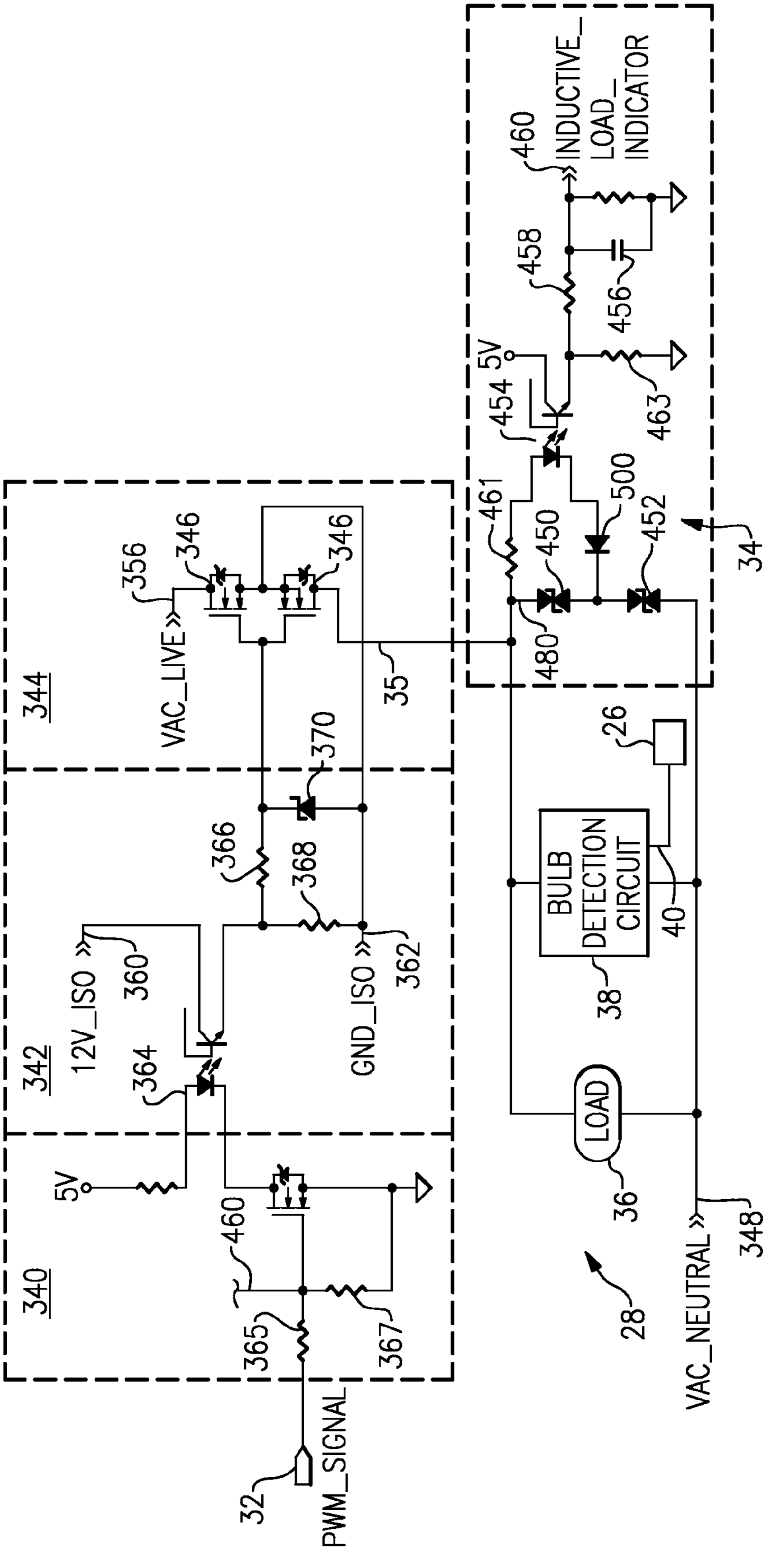
FIG. 2 is a schematic view of a dimmer circuit for an electric light.

FIG. 2 schematically shows a dimmer circuit, such as the main circuitry 28 as shown in FIG. 1. A pulse width modulation control from a microcontroller, such as microcontroller 26, communicates into a dimmer circuit 28 to control the power supplied to an outlet line 35. Outlet line 35 communicates to a load 36. An inductive load sensing circuit 34 also communicates with power supply line 35. The dimmer circuit 28 may be any appropriate circuit, or may be as described below One example embodiment of the dimmer circuit is illustrated in FIG. 2. The microcontroller 26 provides a timing control signal input to the timing portion 340. The timing control signal in one example comprises a pulse width modulation control signal 32. The timing control signal controls when the dimming portion 342 activates the MOSFET switches 346 of the power train portion 344 to control the amount of power supplied to a load 36. The microcontroller 26 determines how to set the timing control signal based upon what setting a user selects (e.g., what dimming level is desired). In one example, the microcontroller 26 uses known techniques for providing the pulse width modulation input to achieve a desired corresponding amount of dimming.

The MOSFETs 346 in one example operate according to a known reverse phase control strategy when the gate and source of each is coupled with a sufficient voltage to set the MOSFETs 346 into an operative state (e.g., turn them on) so that they allow power from a source 356 (e.g., line AC) to be supplied to the load 36. In the reverse phase control example, the MOSFETs 346 are turned on at 0 volts and turned off at a high voltage. In another example a forward phase control strategy is used where the MOSFETs 346 turn on at a high voltage and off at 0 volts. Another example includes turning the MOSFETs 346 on at a non-zero voltage and turning them off at another non-zero voltage.

The dimming portion 342 controls when the power train portion 344 is on and, therefore, controls the amount of power provided to the load 36. Controlling the amount of power provided to a light bulb controls the intensity of light emitted by the bulb, for example.

In this example, an isolated DC voltage source 360 is selectively coupled directly to the gate and source of the MOSFETs 346 for setting them to conduct for delivering power to the load. The isolated DC voltage source 360 has an associated floating ground 362. A switch 364 responds to the timing control signal input from the microcontroller 326 and enters an operative state (e.g., turns on) to couple the isolated DC voltage source 360 to the MOSFETs 346. In the illustrated example, the switch 364 comprises an opto-coupler component. Other examples include a relay switch or a transformer component for selectively coupling the isolated DC voltage source 360 to the MOSFETs 346.

In one example, the isolated DC voltage source 360 provides 12 volts. In another example, a lower voltage is used. The voltage of the isolated DC voltage source 360 is selected to be sufficient to turn on the MOSFETs 346 to the saturation region. One example includes using an isolated DC-DC converter to achieve the isolated DC voltage source 360. Another example includes a second-stage transformer. Those skilled in the art who have the benefit of this description will realize what components will work best for including an isolated DC voltage source in their particular embodiment.

The illustrated example includes voltage controlling components for controlling the voltage that reaches the gate and source of the MOSFETs 346. The illustrated example includes resistors 366 and 368 and a zener diode 370. The resistor 366 sets the turn on speed or the time it takes to turn on the MOSFETs 346. The resistors 366 and 368 set the turn off speed or the time it takes to turn off the MOSFETs 346. In one example, the resistor 368 has a much higher resistance compared to that of the resistor 366 such that the resistor 368 effectively sets the turn off time for the MOSFETs 346. Selecting an off speed and on speed allows for avoiding oscillation of the MOSFETs 346 and avoiding generating heat if the MOSFETs 346 were to stay in a linear operation region too long.

The zener diode 370 provides over voltage protection to shield the MOSFETs from voltage spikes and noise, for example. The zener diode 370 is configured to maintain the voltage provided to the MOSFET gate and source inputs at or below the diode's reverse breakdown voltage in a known manner. One example does not include a zener diode.

One advantage to the disclosed example is that the MOSFETs can be fully controlled during an entire AC cycle without requiring a rectifier. The disclosed example is a more efficient circuit arrangement compared to others that relied upon RC circuitry and a rectifier for controlling the MOSFETs.

The inductive load sensor circuit need not necessarily be incorporated into the dimmer circuit. If such a circuit is included, it may be any type inductive load sensor if one is included. One reliable circuit is described below.

The output 35 of the dimmer circuit passes toward the load 36. The load 36 may be a lamp plugged into the terminals of an electrical outlet. On the other hand, the load may be hardwired. The inductive load sensor determines when something other than a light is at the load. In such cases, it may be desirable to prevent any dimming.

A pair of diodes 450 and 452 (TVSs) are positioned on a line 480 parallel to load 36. The TVS 450 preferably has a high impedance, until a low voltage limit is met. The low voltage limit may be on the order of 5 volts, however, any other voltage may be utilized. The TVS 452 has a high impedance until a much higher voltage limit is met, on the order of hundreds of volts, for example. Again, the specific voltage should not be limiting on this invention, however in one embodiment, it was in the area of 200 volts for 120 volt AC power.

As long as there is no voltage spike received back upstream from the load 36, the dimming of the power directed through output 447 should occur normally. Line 480 effectively clamps the power. If an inductive load, such as a vacuum cleaner motor, is plugged into the load 36, then there will be back EMF pulses, when the load is "dimmed," which create voltage spikes.

When voltage spikes exceed the sum of the voltage limits of the TVS 450, and TVS 452, a voltage of the value of the TVS 450 will be supplied downstream into the signal circuit, and through an optical coupler 454 and resistor 463. The purpose of the capacitor 456 and resistor 458 is to provide a low pass filtering. Resistor 463, resistor 458 and capacitor 456 together provide time constant control over the output to an output indicator line 460. A resistor 461 is provided to limit the current.

The voltage from the TVS diode 450 is coupled to the resistor 463, and creates a signal on the line 460.

As shown for example in the box 340, the line 460 can communicate back into the intersection of resistors 465 and 467. This is but one way of achieving turning the dimming circuitry off such that full power is delivered to the output 447 when a signal is put on the output line 460. Any other method of using the signal on line 460 to stop dimming may be used.

The load 36 may be a hard-wired light socket, or may be an electrical outlet that may receive a plugged in light. As mentioned above, in modern lighting, incandescent bulbs are often utilized but so are fluorescent bulbs. It may be that the microcontroller 26 is provided with separate control schemes for controlling the dimming of an incandescent bulb and a fluorescent bulb. Thus, a bulb detection circuit 38 is provided to detect the bulb type on the load 36. The output of the bulb detection circuit 38 goes to a line 40 to the microcontroller 26.

In one proposed dimming control, a different control algorithm and parameters in the software may be used for dimming one type of bulb relative to the other. As an example, should a fluorescent bulb be identified, the pulse width modulated signal may be controlled so that starting voltage and energy is high enough that it will start the bulb. Also, for achieving soft-on or soft-off, a different set of time constant control parameters may be required since a fluorescent bulb needs a longer time to start and a longer time to change from one light level to another light level compared to an incandescent bulb. As an example, for soft light for a fluorescent bulb, the light level may be maintained at a lowest permitted level for at lest a period of time (one second, for example) and then the soft-on starts. The time constant for each light level during soft-on and off, can be relatively short (16 ms or longer, for example). Various brands of fluorescent bulbs may have a recommended minimum energy level, and it may well be that dimming below that minimum level is not advised. Thus, as an example, it may well be that the pulse width modulation voltage is only dimmed down to a low level (22%, for example).

Typically, the light assembly to be dimmed may include fluorescent bulbs that have their own ballast. However, it may be that a ballast is incorporated into the control circuit of this invention.

Figure 3:
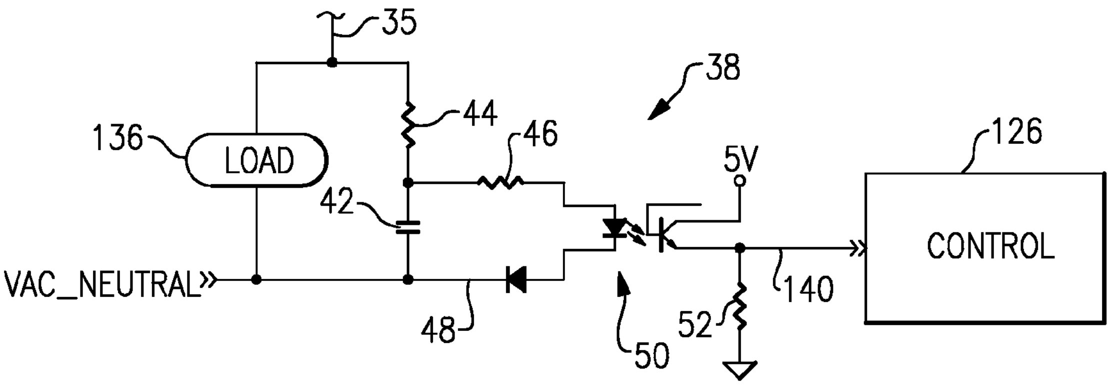
FIG. 3 illustrates a circuit under one embodiment of this invention.

As shown in FIG. 3, one sample bulb detection circuit 38 includes a resistor 44 and a resistor 46 positioned with a capacitor 42. A diode 48 ensures that only positive voltage will flow through the RC circuit. An optical coupler 50 is shown for coupling the signal from the RC circuit downstream to an outlet line 140, and to a control 126. A resistor 52 is positioned off outlet line 140. The control 126 and a load 136 may be the same load 36 and 26 as in the FIG. 2 embodiment. However, the present invention is operable to detect whether the load 136 is present, or is a short circuit. Thus, loads other than the light bulb load of FIG. 2 would benefit from the circuit 38. That is, while circuit 38 is called a bulb detection circuit, it has benefits far beyond the detection of a bulb type. Further, the resistance provided at the load 136 can also be measured fairly accurately using the circuit 38. This resistance measurement can be used in any application.

The use of the circuit 38 to identify a bulb type will now be explained. The bulb type is distinguished by its resistance. The resistance is translated to a discharge time measurement of an RC circuit. In many applications, such as the dimmer circuit of FIG. 2, current or resistance is difficult to directly measure during the circuit operation, and could be expensive to implement.

To determine the bulb type on the load 136, a low voltage, controlled by a pulse width modulation input such as at 30, is applied to the load. The voltage is applied for a short time T ($T>R_{44}*C_{42}$), and low enough that a fluorescent bulb will not get started at all by this voltage. The applied voltage is then cut off, and capacitor 42 begins to discharge. The resistance of resistor 46 is much larger than the resistance of resistor 44 (e.g., $R_{46}>10*R$44), and the resistance of the resistor 44 is normally around several kilo-ohms.

If the load is an incandescent bulb, the discharge time should be approximately equal to $R_{44}*C_{42}$ since $R_{46}$ is $>>R_{44}$ and $R_{incandescent}$ is $<<R_{44}$.

If the load is a fluorescent bulb or if there is no load at all, the discharge time should be approximately $R_{46}*C_{42}$. This is true since the input resistance of a fluorescent bulb which has not been started is much larger than $R_{46}$. By setting a time constant predetermined level or threshold between $R_{44}*C_{42}$ and $R_{46}*C_{42}$, the circuit can identify whether an incandescent bulb is received at the load 136. The signal is passed downstream through the optical coupler, to the control 126.

If an incandescent light is not indicated, the next step is to determine whether there is no load at all or a fluorescent bulb in the load 136.

A voltage is again applied by the pulse width modulation signal 32 to the load. This voltage is high enough and applied long enough so that a fluorescent bulb will begin to light. The applied voltage is cut off at a peak value, and the capacitor 42 starts to discharge. If there is no load, the discharge time constant should be approximately $R_{46}*C_{42}$. If there is a fluorescent bulb in the load, $C_{42}$ will discharge much faster through $R_{44}$ until the fluorescent bulb becomes shut back down due to the low voltage input. Then, $C_{42}$ will discharge through $R_{46}$. Therefore, the overall discharge time in this case will be much shorter than $R_{46}*C_{42}$. By setting a time constant threshold that is close to $R_{46}*C_{42}$, one can identify whether there is an open circuit on the load or fluorescent bulb.

The optical coupler and resistor 52 translate the discharge time measurement to a pulse width modulated output signal. The measurement accuracy can be increased by putting a large resistor R in parallel with capacitor 42 (e.g., $R>10*R$46).

Figure 4:
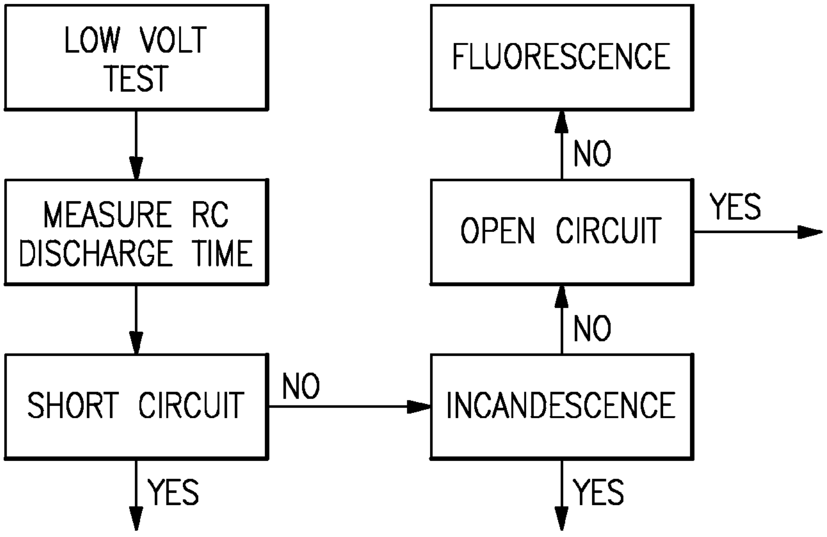
FIG. 4 is a flow chart of a method of identifying a bulb type.

This basic testing method is illustrated in the flowchart of FIG. 4. While one circuit is disclosed, any method and circuit for bulb detection would come within the scope of this invention.

The short circuit detection could be summarized with the following description. When a load is shorted, the capacitor 42 will never get charged up, or it will discharge through resistor 44 if the capacitor 42 had an initial voltage at the time the circuit becomes shorted. When a voltage is applied to the load, there should be a logic high signal appearing at the outlet 140 after a maximum delay of $R_{44}*C_{42}$. If such a signal is not seen after applying a voltage to the load for the time constant $R_{44}*C_{42}$, a short circuit can be identified. By selecting the values of $R_{44}$ and $C_{42}$ so that the time constant is shorter than the time period under which a protected component could be subject to damage from the short circuit, the electrical component such as a MOSFET, can be effectively protected.

While the diodes in the optical coupler 50 and diodes 48 are shown for detecting a positive voltage cycle, the circuit can be reversed to detect a negative voltage cycle by reversing the directions of the diodes.

A circuit like circuit 38 can be utilized to measure resistance, for purposes other than bulb detection. Similarly, independent of what is at the load 136, a circuit 38 can identify the presence of a short circuit in any circuit application.

As a method of measuring resistance, the circuit provides an indirect way of measurement where the direct resistance measurement is difficult or expensive to implement. As a general short circuit detector, the response time can be much faster than other methods, such as fast reaction fuses. This method may have wide application in situations where direct resistance or current monitoring is difficult or expensive, or response time to a short circuit must be very fast. One example might be a MOSFET short circuit protection such as in a dimmer application. Even fast reaction fuses may sometimes be too slow to protect the MOSFET when there is a short circuit. With any short circuit detection, a control can shut off power to protect the circuit or any part thereof.

Although embodiments of this invention have been disclosed, a worker of ordinary skill in this art would recognize that certain modifications would come within the scope of this invention. For that reason, the following claims should be studied to determine the true scope and content of this invention.

What is claimed is:

1. A lighting control circuit including:

a dimmer circuit for dimming a lighting source associated with the dimmer circuit; and a bulb detection circuit for determining the type of lighting source received at a load associated with the dimmer circuit, the bulb detection circuit including an RC circuit, the bulb detection determining the type of lighting source in response to a RC circuit time constant of the RC circuit.

2. The lighting control circuit as set forth in claim 1, wherein the bulb detection circuit can identify if an incandescent light is received in the load.

3. The lighting control circuit as set forth in claim 2, wherein the bulb detection circuit can also identify whether a fluorescent light is received in the load.

4. The lighting control circuit as set forth in claim 3, wherein one of a short circuit and open circuit is identified if neither an incandescent or fluorescent light is identified.

5. The lighting control circuit as set forth in claim 1, wherein the RC circuit time constant is measured after a voltage is applied to the load.

6. The lighting control circuit as set forth in claim 5, wherein a first voltage is initially applied to the load, and the RC circuit time constant is utilized to estimate the resistance of the load.

7. The lighting control circuit as set forth in claim 6, wherein a short circuit is identified if a capacitor of the RC circuit cannot be charged up after a RC time constant; if the capacitor can be charged up and the discharge time constant is identified to be below a threshold, the bulb detection circuit determines that an incandescent light is received at the load.

8. The lighting control circuit as set forth in claim 7, wherein if the RC circuit time constant is not below the predetermined threshold, then a second voltage higher than the first voltage is applied to the load, and the circuit determines whether the RC time constant is above a second threshold, with a fluorescent light being identified in the load if the RC circuit time constant is below the second threshold, and an open circuit being identified if the RC circuit time constant is above the second threshold.

9. The lighting control circuit as set forth in claim 8, wherein the RC circuit includes a first resistor positioned intermediate a load and the capacitor, and a second resistor forming a T-connection with the first resistor and the capacitor.

10. The lighting control circuit as set forth in claim 9, wherein the resistance of the second resistor is greater than the resistance of the first resistor.

11. A method of identifying a short circuit comprising the steps of:

(1) applying a voltage to a load, and through an RC circuit and determining a type of light source at the load in response to a RC circuit time constant of the RC circuit;

(2) translating a charge or discharge time constant of the RC circuit to a pulse width modulated output signal using an optocoupler; and (3) identifying a short circuit in response to the pulse width modulated output signal indicating that a capacitor of the RC circuit can not be charged up after the time constant of the RC circuit.

12. The method as set forth in claim 11, wherein the short circuit identification is used to protect a component, and the RC circuit is designed to provide sufficiently fast detection to protect the component.

13. The method as set forth in claim 11, wherein the RC circuit includes a first resistor positioned intermediate a load and a capacitor, and a second resistor forming a T-connection with the first resistor and a capacitor to pass the time constant signal downstream.

14. A method of measuring a resistance of a load comprising the steps of:

(1) providing an RC circuit associated with a load, the RC circuit including a first resistor positioned intermediate a load and a capacitor, and a second resistor forming a T-connection with the first resistor and the capacitor to pass the time constant signal downstream;

(2) measuring a discharge time constant of the RC circuit; and (3) determining a resistance of the load in response to the discharge time constant and in response to a magnitude of a capacitor of the RC circuit;

(4) identifying the load as including an incandescent lighting source in response to the time constant being approximately equal to a capacitance of the RC circuit multiplied by a resistance of the first resistor, and (5) identifying the load as including a fluorescent lighting source in response to the time constant being approximately equal the capacitance of the RC circuit multiplied by a resistance of the second resistor.

15. The method as set forth in claim 14, wherein the resistance of the second resistor is greater than the resistance of the first resistor.

16. A method of operating a lighting control circuit including the steps of:

(1) providing a dimmer circuit for dimming a light associated with the dimmer circuit, the light being received at a load controlled by the dimmer circuit;

(2) measuring an RC circuit time constant after a voltage is applied to the load; and (3) utilizing the RC circuit time constant to determine the type of bulb associated with the load controlled by the dimmer circuit.

17. The method as set forth in claim 16, wherein the bulb detection circuit identifies if an incandescent light bulb is received in the load.

18. The method as set forth in claim 17, wherein the bulb detection circuit also identifies whether a fluorescent light is received in the load.

19. The method as set forth in claim 18, wherein one of a short circuit and an open circuit is identified if neither an incandescent or fluorescent light is identified.

20. The method as set forth in claim 16, wherein a voltage is initially applied to the load, and the RC circuit time constant is utilized to estimate the resistance of the load.

21. The method as, set forth in claim 20, wherein a short circuit is identified if the capacitor can not be charged up after the RC time constant; if the capacitor can be charged up and the RC circuit time constant is identified to be below a threshold, the bulb detection circuit determines that an incandescent bulb is received at the load.

22. The method as set forth in claim 21, wherein if the RC circuit time constant is not below the predetermined threshold, then a higher voltage is applied to the load, and the circuit determines whether the RC time constant is above a second threshold, with a fluorescent bulb being identified in the load if the RC circuit time constant is below the second threshold, and an open circuit being identified if the RC circuit time constant is above the second threshold.

23. The method as set forth in claim 22, wherein the RC circuit includes a first resistor positioned intermediate a load and a capacitor, and a second resistor forming a T-connection with the first resistor and the capacitor, and wherein the resistance of the second resistor is greater than the resistance of the first resistor.

24. A control capable of identifying a short circuit comprising:

a voltage input; and an RC circuit having a first resistor positioned intermediate a load and a capacitor, and a second resistor forming a T-connection with the first resistor and the capacitor to pass the time constant signal downstream, determine type of light source at the load in response to a RC circuit time constant of the RC circuit, a charge or discharge time constant of the RC circuit being translated to a pulse width modulated output signal;

a control comparing the time constant to a threshold, and identifying a short circuit based upon the pulse width modulated output signal indicating that a capacitor of the RC circuit can not be charged up after the time constant.

25. The control as set forth in claim 24, wherein the RC circuit includes a first resistor positioned intermediate a load and a capacitor, and a second resistor forming a T-connection with the first resistor and the capacitor.

26. The control as set forth in claim 24, wherein a short circuit is identified if the capacitor in the RC circuit can not be charged up after a time constant.

27. A circuit capable of measuring a resistance comprising:

a voltage input; and an RC circuit including a first resistor positioned intermediate a load and a capacitor, and a second resistor forming a T-connection with the first resistor and the capacitor to pass the time constant signal downstream, associated with a load, a discharge time constant of the RC circuit being sent to a control, said control determining a resistance of the load in response to the discharge time constant and in response to a magnitude of a capacitor of the RC circuit; and wherein the load is identified as including an incandescent lighting source in response to the time constant being approximately equal to a capacitance of the RC circuit multiplied by a resistance of the first resistor, and wherein the load is identified as including a fluorescent lighting source in response to the time constant being approximately equal the capacitance of the RC circuit multiplied by a resistance of the second resistor.

28. The circuit as set forth in claim 27, wherein the resistance of the second resistor is greater than the resistance of the first resistor.

* * * * *

UNITED STATES PATENT AND TRADEMARK OFFICE

CERTIFICATE OF CORRECTION

PATENT NO. : 7,969,100 B2
APPLICATION NO. : 11/749826
DATED : June 28, 2011
INVENTOR(S) : Jian Xu et al.

It is certified that error appears in the above-identified patent and that said Letters Patent is hereby corrected as shown below:

IN THE CLAIMS:

Claim 24, Column 8, line 27: insert --and-- between “downstream,” and “determine”

Signed and Sealed this
Eighth Day of May, 2012

David J. Kappos
*Director of the United States Patent and Trademark Office*